United States Patent
Park et al.

(10) Patent No.: US 7,682,906 B2
(45) Date of Patent: Mar. 23, 2010

(54) METHOD OF MANUFACTURING A NON-VOLATILE MEMORY DEVICE

(75) Inventors: Young-Geun Park, Suwon-si (KR); Han-Mei Choi, Seoul (KR); Seung-Hwan Lee, Suwon-si (KR); Sun-Jung Kim, Suwon-si (KR); Se-Hoon Oh, Hwaseong-si (KR); Young-Sun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 126 days.

(21) Appl. No.: 11/907,162

(22) Filed: Oct. 10, 2007

(65) Prior Publication Data

US 2008/0085583 A1  Apr. 10, 2008

(30) Foreign Application Priority Data

Oct. 10, 2006   (KR) ...................... 10-2006-0098365

(51) Int. Cl.
*H01L 21/8247* (2006.01)

(52) U.S. Cl. .............................. 438/261; 257/E21.179

(58) Field of Classification Search ......... 438/257–267; 257/21.179
See application file for complete search history.

(56) References Cited

U.S. PATENT DOCUMENTS

| | | | |
|---|---|---|---|
| 6,187,633 B1 * | 2/2001 | Dong et al. | 438/261 |
| 6,306,777 B1 | 10/2001 | Ogle, Jr. et al. | |
| 6,803,272 B1 * | 10/2004 | Halliyal et al. | 438/240 |
| 2006/0008997 A1 | 1/2006 | Jang et al. | |

* cited by examiner

*Primary Examiner*—Richard A. Booth
(74) *Attorney, Agent, or Firm*—Lee & Morse, P.C.

(57) ABSTRACT

A method of manufacturing a non-volatile memory device includes forming a tunnel isolation layer forming a tunnel isolation layer on a substrate, forming a conductive pattern on the tunnel isolation layer, forming a lower silicon oxide layer on the conductive pattern, treating a surface portion of the lower silicon oxide layer with a nitridation treatment to form a first silicon oxynitride layer on the lower silicon oxide layer, forming a metal oxide layer on the first silicon oxynitride layer, forming an upper silicon oxide layer on the metal oxide layer, and forming a conductive layer on the upper silicon oxide layer.

19 Claims, 7 Drawing Sheets

METHOD OF MANUFACTURING A NON-VOLATILE MEMORY DEVICE

BACKGROUND OF THE INVENTION

1. Field of the Invention

Embodiments of the present invention relate to a method of manufacturing a non-volatile memory device. More particularly, embodiments of the present invention relate to a method of manufacturing a non-volatile memory device having a blocking layer exhibiting reduced leakage current.

2. Description of the Related Art

In general, semiconductor memory devices may be classified as either volatile or non-volatile memory devices. Volatile memory devices, e.g., dynamic random access memory (DRAM) devices and/or static random access memory (SRAM) devices, may have relatively high input/output (I/O) speeds, and may lose data stored therein when power is shut off. In contrast, non-volatile memory devices, e.g., read-only memory (ROM) devices, electrically erasable programmable ROM (EEPROM) devices, and/or flash EEPROM devices, may have relatively slow I/O speeds, and may be able to maintain data stored therein even when power is shut off.

In the conventional non-volatile memory device, data may be electrically stored, i.e., programmed or erased, through a Fowler-Nordheim (F-N) tunneling mechanism and/or through a channel hot electron injection mechanism. Further, the conventional non-volatile memory device may be classified as either a floating gate type or a charge trap type, e.g., silicon-oxide-nitride-oxide semiconductor (SONOS) devices or metal-oxide-nitride-oxide semiconductor (MONOS) devices. The floating gate type non-volatile memory device may include a gate structure and source/drain regions on a semiconductor substrate.

More specifically, the conventional gate structure of the floating gate type non-volatile memory device may include a tunnel insulation layer, a floating gate electrode, a blocking layer, and a control gate electrode, while the blocking layer may have a multilayered dielectric structure including a silicon nitride layer between two silicon oxide layers.

Attempts have been made to form a blocking layer using a metal oxide layer instead of the silicon nitride layer. However, use of a metal oxide layer between two silicon oxide layers may increase diffusion of materials between the metal oxide layer and the silicon oxide layers, thereby deteriorating interface morphology therebetween. A deteriorated morphology between the layers of the blocking layer may increase leakage current through the blocking layer, thereby reducing operability and reliability of the non-volatile memory device.

SUMMARY OF THE INVENTION

Embodiments of the present invention are therefore directed to a method of manufacturing a non-volatile memory device, which substantially overcomes one or more of the problems due to the limitations and disadvantages of the related art.

It is therefore a feature of an embodiment of the present invention to provide a method of manufacturing a non-volatile memory device having a blocking layer exhibiting reduced leakage current therethrough.

At least one of the above and other features of the present invention may be realized by providing a method of manufacturing a non-volatile memory device including forming a tunnel isolation layer on a substrate, forming a conductive pattern on the tunnel isolation layer, forming a lower silicon oxide layer on the conductive pattern, treating a surface portion of the lower silicon oxide layer with a nitridation treatment to form a first silicon oxynitride layer on the lower silicon oxide layer, forming a metal oxide layer on the first silicon oxynitride layer, forming an upper silicon oxide layer on the metal oxide layer, and forming a conductive layer on the upper silicon oxide layer.

Forming the metal oxide layer may include employing a metal oxide having a higher dielectric constant than silicon nitride. Forming the metal oxide layer may include employing one or more of hafnium, zirconium, tantalum, aluminum, lanthanum, cerium, praseodymium, neodymium, samarium, europium, gadolinium, terbium, dysprosium, holmium, erbium, thulium, ytterbium, and/or lutetium. Treating the surface portion of the lower silicon oxide layer with the nitridation treatment may include performing a plasma nitridation treatment using nitrogen gas and/or ammonia gas. Treating the surface portion of the lower silicon oxide layer with the nitridation treatment may include using a remote plasma system or a direct plasma system. Treating the surface portion of the lower silicon oxide layer with the nitridation treatment may include processing at a temperature of about 500° C. or less. Treating the surface portion of the lower silicon oxide layer with the nitridation treatment may include forming the first silicon oxynitride layer to a thickness of about 5 angstroms to about 20 angstroms.

The method may further include performing a plasma nitridation treatment on the metal oxide layer to form a metal oxynitride layer between the metal oxide layer and the upper silicon oxide layer. Performing the plasma nitridation treatment on the metal oxide layer may include processing at a temperature of about 500° C. or less. Performing the plasma nitridation treatment on the metal oxide layer may include processing at a temperature of about 350° C. or less. Performing the plasma nitridation treatment on the metal oxide layer may include processing at a temperature of about 250° C. to about 350° C. Performing the plasma nitridation treatment on the metal oxide layer may include forming the metal oxynitride layer to a thickness of about 5 angstroms to about 20 angstroms.

The method may further include forming a second silicon oxynitride layer between the metal oxide layer and the upper silicon layer. The second silicon oxynitride layer may be formed directly on the metal oxide layer. Forming the second silicon oxynitride layer may include performing a middle temperature oxynitride deposition or a high density plasma deposition on the metal oxide layer. The second silicon oxynitride layer may be formed to a thickness of about 5 angstroms to about 20 angstroms. Forming the second silicon oxynitride layer may be performed in-situ with forming the upper silicon oxide layer.

The method may further include forming a gate structure on the substrate by sequentially patterning the conductive layer, the upper silicon oxide layer, the metal oxide layer, the silicon oxynitride layer, the conductive pattern, and the tunnel isolation layer. The method may further include forming source/drain regions at surface portions of the substrate adjacent to the gate structure.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-98365, filed on Oct. 10, 2006 in the Korean Intellectual Property Office, and entitled: "Method of Manufacturing a Non-Volatile Memory Device," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

An exemplary embodiment of a method of manufacturing a non-volatile memory device in accordance with the present invention will now be more fully described with reference to FIGS. 1-10.

Figure 1:
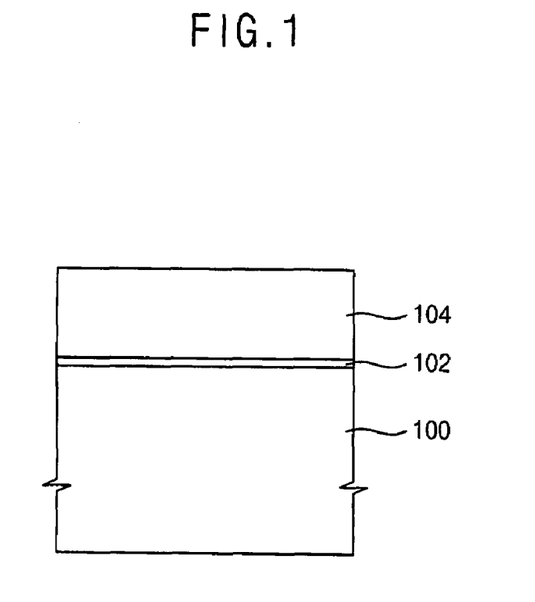
FIGS. 1-10 illustrate cross-sectional views of sequential stages during manufacturing of a non-volatile memory device in accordance with an embodiment of the present invention.

Referring to FIG. 1, a pad oxide layer 102 may be formed on a semiconductor substrate 100, e.g., a silicon wafer, followed by formation of a mask layer 104 thereon. More specifically, the pad oxide layer 102 may be formed on the semiconductor substrate 100 to a thickness of about 70 angstroms to about 100 angstroms to facilitate surface treatment of the semiconductor substrate 100. The pad oxide 102 may be formed by, e.g., a thermal oxidation process or a chemical vapor deposition (CVD) process, at a temperature of about 750° C. to about 900° C. The mask layer 104 may be formed of, e.g., silicon nitride, on the pad oxide layer 102 to a thickness of about 1,500 angstroms by, e.g., a plasma-enhanced CVD (PECVD) process or a low pressure CVD (LPCVD) process using a source gas including, e.g., dichlorosilane ($SiH_2Cl_2$) gas, silane ($SiH_4$) gas, and/or ammonia ($NH_3$) gas.

Figure 2:
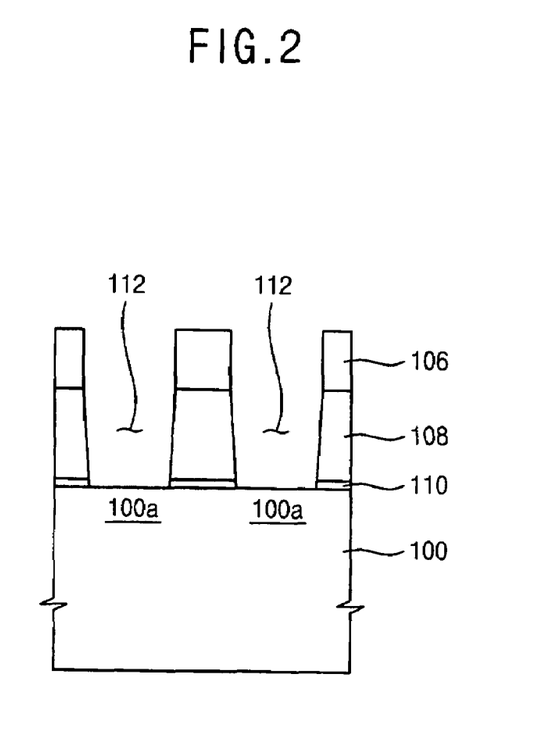

Referring to FIG. 2, a photoresist pattern 106 may be formed on the mask layer 104 by, e.g., a photolithography process, so predetermined portions of the mask layer 104 may be exposed through the photoresist pattern 106. Then, portions of the mask layer 104 exposed through the photoresist pattern 106 and corresponding portions of the pad oxide layer 102 may be sequentially removed from the semiconductor substrate 100 to form a mask pattern 108 and an oxide pattern 110, respectively, on the semiconductor substrate 100, as illustrated in FIG. 2. The oxide pattern 110 and the mask pattern 108 may define at least one first opening 112, as further illustrated in FIG. 2, so an upper surface of the semiconductor substrate 100 may be exposed to define a device isolation region 100a.

Portions of the mask layer 104 and the pad oxide layer 102 may be removed by, e.g., an etching process using the photoresist pattern 106 as an etching mask. The etching process may include, e.g., a dry etching process and/or a reactive ion etching process. Once formation of the oxide pattern 110 and the mask pattern 108 is complete, the photoresist pattern 106 may be removed from the mask pattern 108 by, e.g., an ashing process and/or a strip process.

Figure 3:
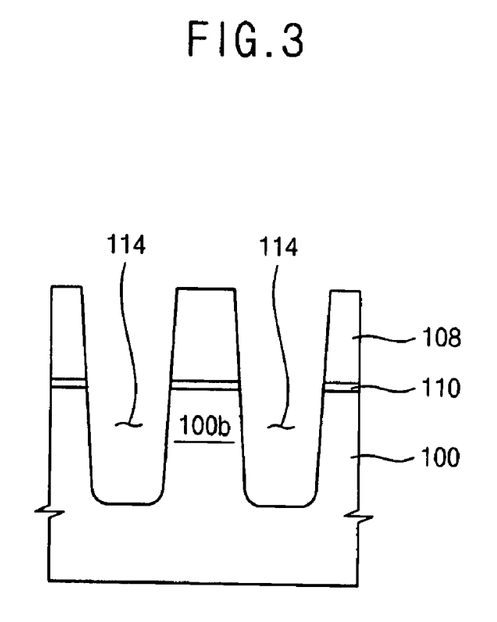

Referring to FIG. 3, the device isolation region 100a may be etched by the etching process using the mask pattern 108 as an etching mask to form at least one trench 114 in the semiconductor substrate 100. More specifically, as illustrated in FIG. 3, the trench 114 may extend the first opening 112 vertically in a first direction, i.e., from an upper surface of the semiconductor substrate 100 downward toward a lower surface thereof, to a predetermined depth. For example, the trench 114 may be formed to a depth of about 1,000 angstroms to about 5,000 angstroms as measured from the upper surface of the semiconductor substrate 100, i.e., an interface between the semiconductor substrate 100 and the oxide pattern 110. It should be noted, however, that other etching processes, e.g., the trench 114 may be formed in the semiconductor substrate 100 using the photoresist pattern 106 as an etching mask, are within the scope of the present invention.

Two adjacent trenches 114 may define an active region 100b therebetween. More specifically, as further illustrated in FIG. 3, the active region 100b may be a portion of the semiconductor substrate 100 overlapping with the oxide pattern 110 and positioned between two adjacent trenches 114. Once the trench 114 is formed, a thermal oxidation treatment may be performed on an inner surface thereof to minimize leakage current therethrough. More specifically, the etching process may damage the semiconductor substrate 100, e.g., high energy ions may damage the silicon structure of the semiconductor substrate 100 during a reactive ion etching process, thereby triggering a leakage current in the semiconductor substrate 100. The thermal oxidation treatment may form a trench oxide layer (not shown) on the inner surface of the trench 114 to a thickness of about 50 angstroms to about 250 angstroms in order to prevent or minimize damage to the silicon structure. Further, a nitride liner (not shown) may be formed on the trench oxide layer to a thickness of about 50 angstroms to about 100 angstroms, so that diffusion of impurities, e.g., carbon (C) and/or hydrogen (H), into the active region 100b may be prevented or substantially minimized.

Figure 4:
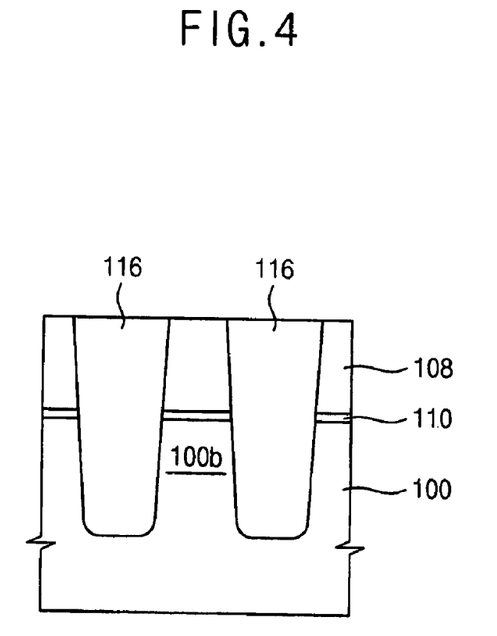

Referring to FIG. 4, a field isolation layer (not shown) may be formed on the semiconductor substrate 100 to a sufficient thickness to fill up the trench 114. The field isolation layer may include a silicon oxide layer, e.g., an undoped silicate glass (USG) layer, a tetraethyl orthosilicate (TEOS) layer, and/or a high-density plasma (HDP) oxide layer, and may be formed by an HDP process using, e.g., silane ($SiH_4$), oxygen ($O_2$), and/or argon (Ar) as a plasma source gas.

Then, the field isolation layer may be partially removed by a planarization process, e.g., chemical mechanical polishing (CMP) process, to expose an upper surface of the mask pattern 108, so that the field isolation layer may remain only in the trench 114 to form a field isolation pattern 116 therein. The field isolation pattern 116 may electrically isolate conductive structures, e.g., unit devices of a memory device, formed on the active region 100b of the semiconductor substrate 100. Although not shown in the figures, the mask pattern 108 may be partially removed from the semiconductor substrate 100 during the planarization process.

Figure 5:
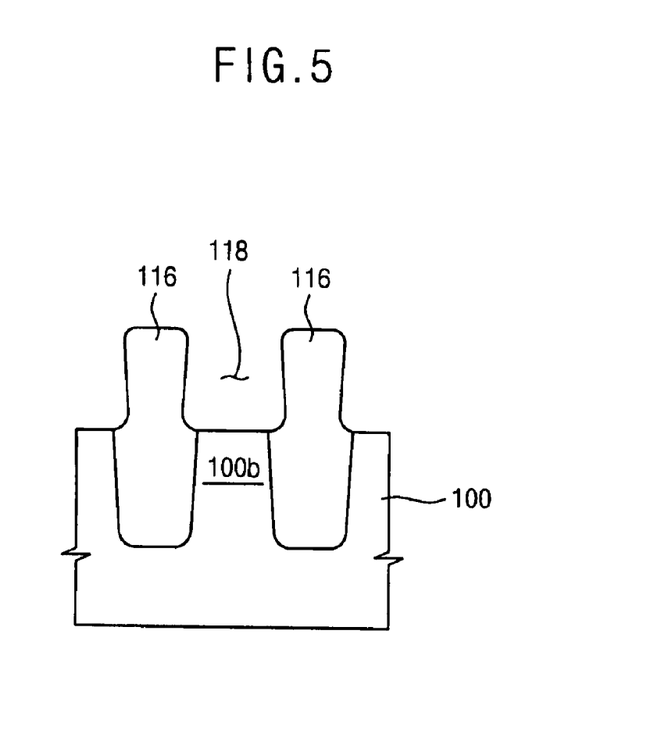

Referring to FIG. 5, the mask pattern 108 and the pad oxide pattern 110 may be removed from the semiconductor substrate 100 to form at least one second opening 118. More specifically, the second opening 118 may be formed between adjacent field isolation patterns 116 to expose an upper surface of the active region 100b, as illustrated in FIG. 5. The mask pattern 108 may be removed by, e.g., a wet etching process with a phosphoric acid solution. The pad oxide pattern 110 may be removed by, e.g., a wet etching process with a diluted HF solution. Portions of the field isolation pattern 116 may be also removed from the substrate 100 during the etching process of the mask pattern 108 and pad oxide pattern 110. For example, portions of the field isolation pattern 116 may be removed, so the second opening 118 may be wider than the active region 100b, as further illustrated in FIG. 5.

Figure 6:
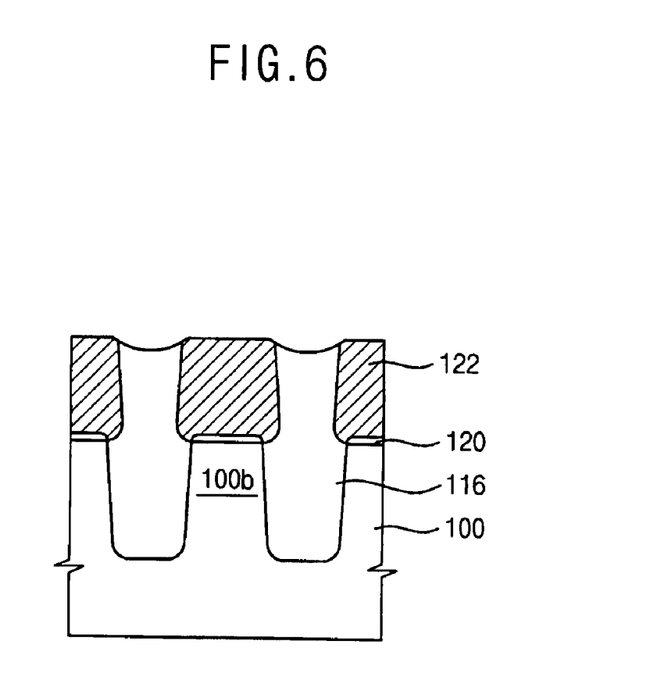

Referring to FIG. 6, a tunnel oxide layer 120 may be formed on the active region 100b of the semiconductor substrate 100. The tunnel oxide layer 120 may include pure silicon oxide, silicon oxide doped with fluorine (F), silicon oxide doped with carbon (C), and/or a low-k material having a low dielectric constant. The tunnel oxide layer 120 may be formed on the active region 100b of the semiconductor substrate 100 to a thickness of about 30 angstroms to about 100 angstroms.

A first conductive layer (not shown) may be formed on the tunnel oxide layer 120 and the field isolation layer 116 to a sufficient thickness to fill up the second opening 118. The first conductive layer may include, e.g., polysilicon doped with impurities, and may be formed at a temperature of about 580° C. to about 620° C. using, e.g., silane ($SiH_4$) gas and/or phosphine ($PH_3$) gas. Then, the first conductive layer may be removed from the semiconductor substrate 100 by a planarization process, e.g., an etch-back process or a CMP process, to expose an upper surface of the field isolation pattern 116, so that the first conductive pattern may remain only in the second opening 118 to form a conductive pattern 122 therein. The conductive pattern 122 may function as a floating gate pattern. Portions of the field isolation pattern 116 may be removed from the semiconductor substrate 100 during the planarization process.

Figure 7:
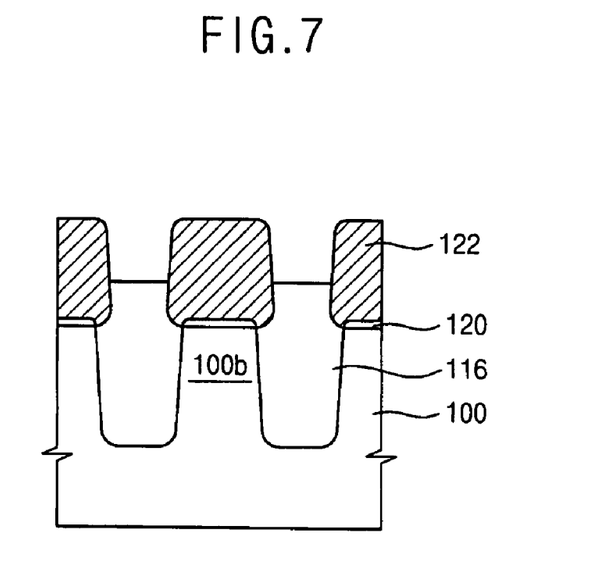

Referring to FIG. 7, an upper portion of the field isolation pattern 116 may be removed from the semiconductor substrate 100 to expose upper portions of sidewalls of the conductive pattern 122. More specifically, the upper portion of the field isolation pattern 116 may be removed by, e.g., an isotropic or an anisotropic etching process, to expose only upper portions of the conductive pattern 122, as illustrated in FIG. 7, so the tunnel oxide layer 120 may not be exposed. Therefore, the tunnel oxide layer 120 may be shielded from potential etching damage, e.g., an etchant or an etching gas. In addition, a corner portion of the conductive pattern 122 may be rounded during etching of the field isolation pattern 116, as further illustrated in FIG. 7.

Figure 8:
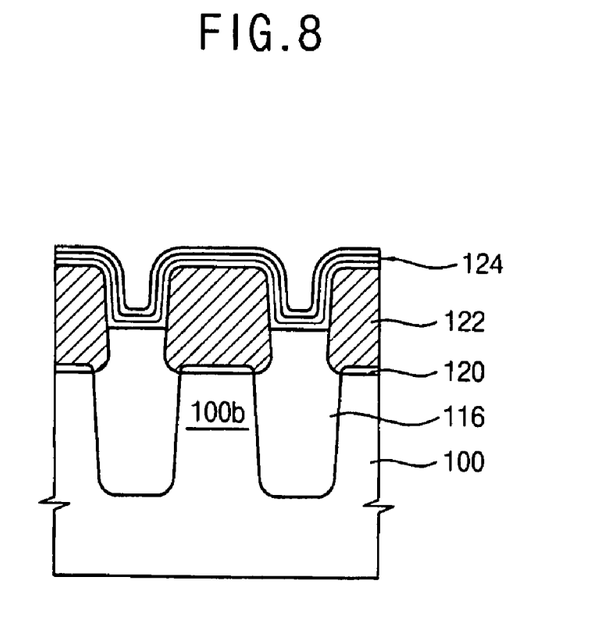
Figure 9:
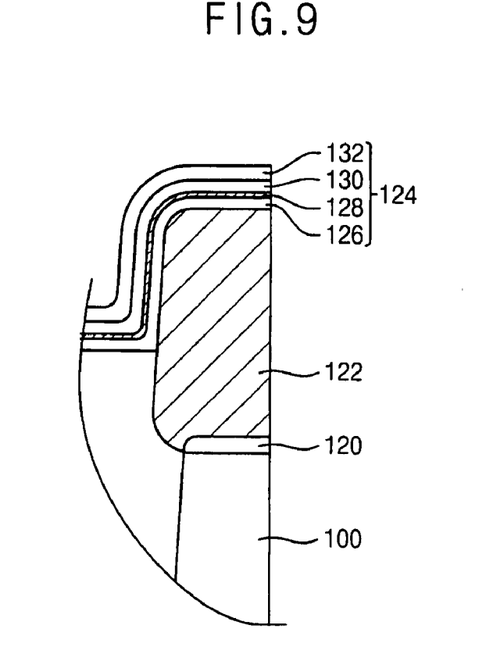

Referring to FIGS. 8-9, a blocking layer 124 may be formed on the conductive pattern 122 and the field isolation pattern 116. The blocking layer 124 may have a multi-layered structure including a lower silicon oxide layer 126, a silicon oxynitride layer 128, a metal oxide layer 130, and an upper silicon oxide layer 132, as illustrated in FIG. 9.

The lower silicon oxide layer 126 may be formed on the conductive pattern 122 and the field isolation pattern 116 to a thickness of about 30 angstroms to about 150 angstroms by, e.g., a middle temperature oxide (MTO) deposition process or an HDP deposition process.

The silicon oxynitride layer 128 may be formed on the lower silicon oxide layer 126 to a thickness of about 5 angstroms to about 20 angstroms. More specifically, plasma nitridation treatment may be performed on an upper surface of the lower silicon oxide layer 126, so a predetermined portion of the lower silicon oxide layer 126, e.g., a thickness of about 5 angstroms to about 20 angstroms thereof, may be transformed into the silicon oxynitride layer 128. A thickness below about 5 angstroms of the silicon oxynitride layer 128 may be insufficient to minimize diffusion through the silicon oxynitride layer 128, while a thickness of more than about 20 angstroms of the silicon oxynitride layer 128 may decrease the dielectric constant of the blocking layer 124. Formation of the silicon oxynitride layer 128 on the lower silicon oxide layer 126 may be advantageous in improving an interface morphology between the lower silicon oxide layer 126 and the metal oxide layer 130.

The plasma nitridation treatment on the lower silicon oxide layer 126 may be performed in a remote plasma system or in a direct plasma system using a gas including, e.g., nitrogen ($N_2$) or ammonia ($NH_3$) gas. The plasma nitridation treatment may be performed at a temperature of about 500° C. or lower, and preferably at a temperature of about 250° C. to about 350° C. If the plasma nitridation treatment is performed in a remote plasma system, a microwave having a frequency of about 2.45 GHz may be used as an energy source.

The metal oxide layer 130 may be formed on the silicon oxynitride layer 128 to a thickness of about 20 angstroms to about 50 angstroms by an atomic layer deposition (ALD) process or a CVD process, and may have a higher dielectric constant than a silicon nitride layer. The metal oxide layer 130 may include a metal, e.g., hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and so forth. Examples of the metal oxide layer 130 may include a hafnium oxide ($HfO_2$) layer, a zirconium oxide ($ZrO_2$) layer, an aluminum oxide ($Al_2O_3$) layer, a hafnium aluminum oxide (HfAlO) layer, a lanthanum oxide ($La_2O_3$) layer, a hafnium lanthanum oxide (HfLaO) layer, an aluminum lanthanum oxide (AlLaO) layer, and so forth.

An exemplary method of forming the metal oxide layer 130 is as follows. It should be noted, however, that even though the exemplary method will be described with respect to formation of a hafnium oxide layer on the silicon oxynitride layer 128 by an ALD process, other materials or methods for forming the metal oxide layer 130 are within the scope of the present invention.

The semiconductor substrate 100 including the silicon oxynitride layer 128 may be loaded into a process chamber (not shown) for the ALD process. For example, the process chamber may be maintained at a temperature of about 150° C. to about 400° C. under a pressure of about 0.1 Torr to about 3.0 Torr. Then, reaction materials, i.e., precursors and carrier gases, may be provided onto the semiconductor substrate 100 in the process chamber for about 0.5 seconds to about 3 seconds. If a liquid precursor is used, e.g., a liquid hafnium precursor, a liquid delivery system (LDS) and a bubbler system may be used to modify the liquid precursor into a gaseous state.

For example, hafnium precursor gases may be carried into the process chamber by a carrier gas, e.g., nitrogen ($N_2$) gas and/or argon (Ar) gas, to form a hafnium precursor layer on the silicon oxynitride layer 128. Examples of hafnium precursor gas may include tetrakis dimethylamino hafnium (TDMAH, $Hf[N(CH_3)_2]_4$), tetrakis ethyl methylamino hafnium (TEMAH, $Hf[N(C_2H_5)CH_3]_4$), tetrakis diethylamino hafnium (TDEAH, $Hf[N(C_2H_5)_2]_4$), tetrakis 1-methoxy-2-methyl-2-propoxy hafnium (Hf-MMP, $Hf[OC(CH_3)_2CH_2OCH_3]_4$), hafnium tertiary butoxide (HTB, $Hf[OC(CH_3)_3]_4$), and/or a mixture thereof.

Provision of the reaction materials onto the semiconductor substrate 100 may facilitate chemisorption of some of the reaction materials onto the silicon oxynitride layer 128 to form the hafnium precursor layer thereon. The remaining reaction materials may be physisorbed onto the hafnium precursor layer or may remain in the process chamber. Next, a first purge gas, e.g., nitrogen ($N_2$) gas and argon (Ar) gas, may be provided into the process chamber for about 0.5 seconds to about 5 seconds to purge the remaining materials, i.e., vacuum discharge, from the process chamber. In other words, the remaining reaction materials, i.e., materials physisorbed onto the hafnium precursor layer and/or materials drifting in the process chamber may be discharged from the process chamber together with the first purge gas by the vacuum discharge process.

After purging the process chamber, an oxidizer may be provided onto the semiconductor substrate 100 in the process chamber, so that the hafnium precursor layer may be oxidized by the oxidizer to form a hafnium oxide layer on the silicon oxynitride layer 128. Examples of the oxidizer may include oxygen ($O_2$), ozone ($O_3$), water vapor ($H_2O$), and/or plasma oxygen ($O_2$). For example, ozone ($O_3$) gas may be provided onto the substrate 100 for about 1 second to about 5 seconds.

Thereafter, a second purge gas may be provided into the process chamber to remove by-products of the hafnium precursor layer and the oxidizer and a residual oxidizer. The second purge gas may be provided into the process chamber for about 1 second to about 5 seconds.

The ALD process for forming the metal oxide layer 130 may be performed on the semiconductor substrate 100 to complete a unit cycle, i.e., form the hafnium oxide layer to a predetermined thickness in a single deposition cycle. In order to increase thickness of the hafnium oxide layer, the ALD process may be repeated as determined by one of ordinary skill in the art, i.e., perform multiple unit cycles, to form the hafnium oxide layer with a desired thickness. For example, the unit cycle of the ALD process may be repeated to form the metal oxide layer 130 to have a thickness of about 50 angstroms or less. A metal oxide layer 130 having a thickness of above about 50 angstroms may be crystallized in a subsequent process.

Next, the upper silicon oxide layer 132 may be formed on the metal oxide layer 130 to a thickness of about 30 angstroms to about 150 angstroms by, e.g., an MTO deposition process or a HDP deposition process.

According to embodiments of the present invention, the silicon oxynitride layer 128 between the lower silicon oxide layer 126 and the metal oxide layer 130 may prevent or substantially minimize diffusion of materials therebetween. For example, the mutual diffusion of silicon and metal may be sufficiently minimized between the silicon oxynitride layer 128 and the metal oxide layer 130, so that the interface morphology therebetween may be improved, thereby decreasing leakage current through the blocking layer 124.

Figure 10:
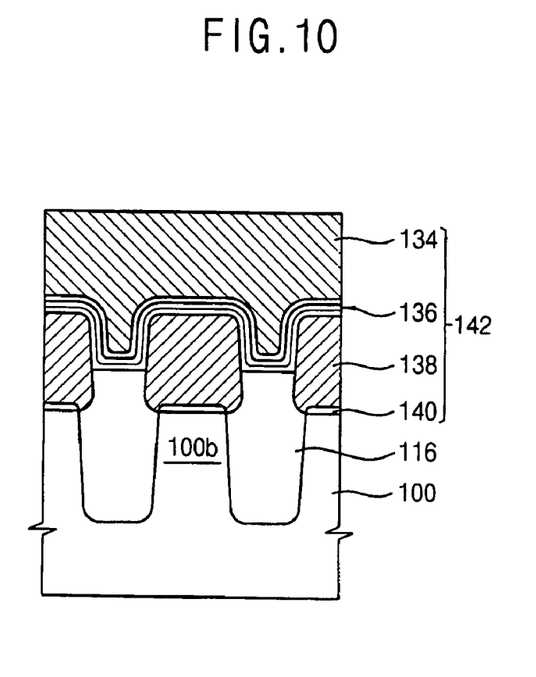

Referring to FIG. 10, a second conductive layer (not shown) may be formed on the blocking layer 124. The second conductive layer may include at least one conductive material, such as polysilicon doped with impurities, metal, e.g., tungsten (W), and/or metal silicide, e.g., tungsten silicide ($WSi_x$), titanium silicide ($TiSi_x$), cobalt silicide ($CoSi_x$), and/or tantalum silicide ($TaSi_x$). The second conductive layer may be patterned by, e.g., an etching process, to form a control gate electrode 134 extending in a second direction, e.g., a direction perpendicular to the first direction. Then, the blocking layer 124, the conductive pattern 122, and the tunnel oxide layer 120 may be sequentially patterned by an etching process to form a blocking pattern 136, a floating gate electrode 138, and a tunnel oxide pattern 140, respectively, so a gate structure 142 including the control gate electrode 134 of a non-volatile memory device may be formed. Although not shown in the figures, source/drain regions (not shown) may be formed on surface portions of the active region 100b of the semiconductor substrate 100 and adjacent to the gate structure 142 by, e.g., an ion implantation process and a heat treatment for activating impurities.

Figure 11:
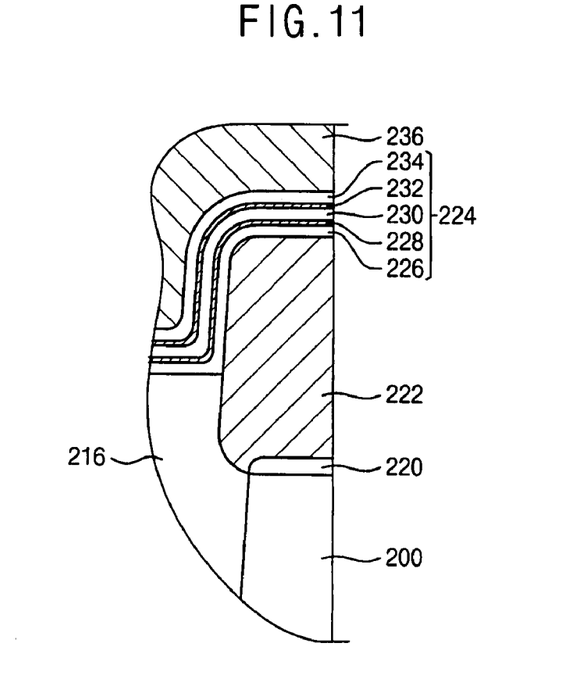
FIG. 11 illustrates an enlarged, partial cross-sectional view of a blocking layer of a non-volatile memory device manufactured in accordance with another embodiment of the present invention.

According to another embodiment illustrated in FIG. 11, a method of manufacturing a non-volatile memory device may be substantially similar to the method described previously with respect to FIGS. 1-10 with the exception of forming a blocking layer 224 to include a metal oxynitride layer 232.

More specifically, as illustrated in FIG. 11, a non-volatile memory device may include a field isolation pattern 216, a tunnel isolation layer 220, a conductive pattern 222, a blocking layer 224, and a control gate electrode 236 on a semiconductor substrate 200. The field isolation pattern 216, tunnel isolation layer 220, conductive pattern 222, and control gate electrode 236 may be substantially similar to the field isolation pattern 116, tunnel isolation layer 120, conductive pattern 122, and control gate electrode 136, respectively, described previously with reference to FIGS. 1-10, and thus, their detailed description will non be repeated herein.

The blocking layer 224 may be formed on the field isolation pattern 216 and the conductive pattern 222, and may include a lower silicon oxide layer 226, a silicon oxynitride layer 228, a metal oxide layer 230, a metal oxynitride layer 232, and an upper silicon oxide layer 234. The lower silicon oxide layer 226, silicon oxynitride layer 228, metal oxide layer 230, and upper silicon oxide layer 234 may be substantially similar to the lower silicon oxide layer 126, silicon oxynitride layer 128, metal oxide layer 130, and upper silicon oxide layer 134, respectively, described previously with reference to FIGS. 8-9, and thus, their detailed descriptions will not be repeated herein.

After formation of the metal oxide layer 230, the nitridation treatment may be performed on the metal oxide layer 230 to form the metal oxynitride layer 232 on a surface of the metal oxide layer 230. The metal oxynitride layer 232 may be formed to a thickness of about 5 angstroms to about 20 angstroms by, e.g., a plasma nitridation treatment, in order to improve an interface morphology between the metal oxide layer 230 and the upper silicon oxide layer 234. When the metal oxynitride layer 232 has a thickness greater than about 20 angstroms, the dielectric constant of the blocking layer 224 may be decreased.

The plasma nitridation treatment may be performed in a remote plasma system or in a direct plasma system using, e.g., nitrogen ($N_2$) gas or ammonia gas ($NH_3$) gas. If the plasma nitridation treatment is performed in a remote plasma system, a microwave having a frequency of about 2.45 GHz may be employed as an energy source. In addition, a temperature of the plasma nitridation treatment may be determined with respect to the materials employed in the metal oxide layer 230, and preferably at a temperature of no more than about 500° C. to prevent crystallization of the metal oxide layer 230. For example, if zirconium oxide is used to form the metal oxide layer 23, a temperature of no more than about 350° C. may be used for the plasma nitridation treatment because zirconium oxide is crystallized at a temperature of about 400° C. Once the metal oxide layer 230 is formed, the control gate electrode 236 is formed thereon, followed by patterning the blocking layer 224, conductive pattern 222, and tunnel oxide layer 220, and formation of source/drain regions on surface portions of the substrate 200 to complete formation of the non-volatile memory device.

Formation of the metal oxynitride layer 232 between the metal oxide layer 230 and the upper silicon oxide layer 234 may be advantageous in minimizing diffusion of silicon and/or metal therebetween, thereby improving the interface morphology between the upper silicon oxide layer 234 and the metal oxide layer 230 and decreasing the leakage current through the blocking layer 234.

Figure 12:
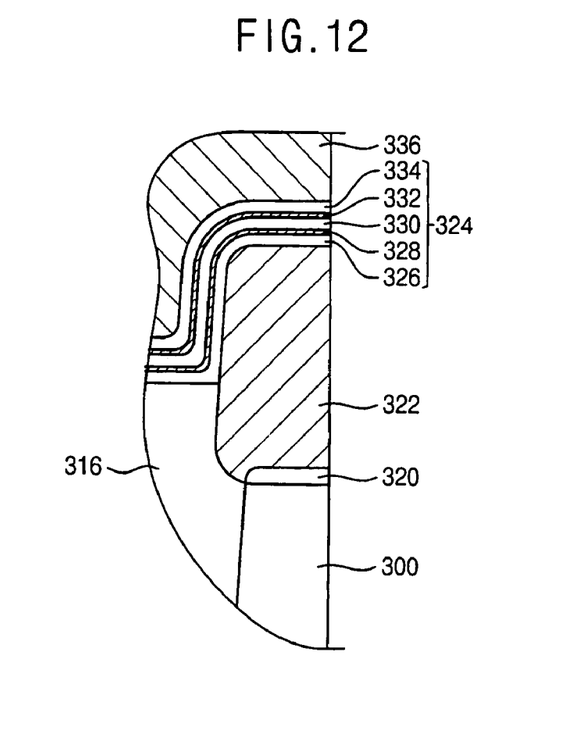
FIG. 12 illustrates an enlarged, partial cross-sectional view of a blocking layer of a non-volatile memory device manufactured in accordance with another embodiment of the present invention.

According to another embodiment illustrated in FIG. 12, a method of manufacturing a non-volatile memory device may be substantially similar to the method described previously with respect to FIG. 11, with the exception of forming a blocking layer 324 to include first and second silicon oxynitride layers 328 and 332, instead of the silicon and metal oxynitride layers 228 and 232.

More specifically, as illustrated in FIG. 12, a non-volatile memory device may include a field isolation pattern 316, a tunnel isolation layer 320, a conductive pattern 322, a blocking layer 324, and a control gate electrode 336 on a semiconductor substrate 300. The processing steps for forming the field isolation pattern 316, tunnel isolation layer 320, conductive pattern 322, and control gate electrode 336 may be substantially similar to steps used to from the field isolation pattern 216, tunnel isolation layer 220, conductive pattern 222, and control gate electrode 236, respectively, described previously with reference to FIG. 11, and thus, their detailed description will non be repeated herein.

The blocking layer 324 may be formed on the field isolation pattern 316 and the conductive pattern 322, and may include a lower silicon oxide layer 326, a first silicon oxynitride layer 328, a metal oxide layer 330, a second silicon oxynitride layer 332, and an upper silicon oxide layer 334. The processing steps for forming the lower silicon oxide layer 326, first silicon oxynitride layer 328, metal oxide layer 330, and upper silicon oxide layer 334 may be substantially similar to the steps described previously with reference to FIG. 11, and thus, their detailed descriptions will not be repeated herein.

The second silicon oxynitride layer 332 may be formed on the metal oxide layer 330 by a middle temperature oxynitride deposition process or an HDP deposition process using a source gas including silicon (Si), a first processing gas including oxygen ($O_2$) gas, and a second processing gas including nitrogen ($N_2$) gas. The second silicon oxynitride layer 332 may be formed to a thickness of about 5 angstroms to about 20 angstroms, and the upper silicon oxide layer 334 may be formed in-situ with the second silicon oxynitride layer 332. The upper silicon oxide layer 334 may be formed on the second silicon oxynitride layer 332 to a thickness of about 30 angstroms to about 150 angstroms. Once the blocking layer 324 is formed, the control gate electrode 336 may be formed thereon, followed by patterning the blocking layer 324, the conductive pattern 322, and the tunnel oxide layer 320, and formation of source/drain regions on surface portions of the substrate 300 to complete formation of the non-volatile memory device.

Formation of the silicon oxynitride layer 332 between the metal oxide layer 330 and the upper silicon oxide layer 334 may be advantageous in minimizing diffusion of silicon and/or metal therebetween, thereby improving the interface morphology between the upper silicon oxide layer 334 and the metal oxide layer 330, and decreasing the leakage current through the blocking layer 334.

EXAMPLES

A non-volatile memory device, i.e., Example 1, was manufactured to include a blocking layer in accordance with an embodiment of the present invention and compared to two conventional non-volatile memory device, i.e., Comparative Examples 1-2. The three non-volatile memory devices were manufactured to include a tunnel isolation layer, a conductive pattern, a blocking layer, and a conductive layer formed sequentially on a silicon semiconductor substrate, followed by patterning thereof to form a gate structure on the substrate. Impurity ions were implanted into surface portions of the substrate adjacent to the gate structure to form source/drain regions. Formation of all elements of the three non-volatile memory devices was substantially identical with the exception of formation of the blocking layer of each non-volatile memory device.

Example 1 the blocking layer was formed as follows. A lower silicon oxide layer was deposited on the conductive pattern to a thickness of 61 angstroms. Then, a plasma nitridation process was performed on the lower silicon oxide layer to form a silicon oxynitride layer thereon. Next, a hafnium oxide layer was formed on the silicon oxynitride layer to a thickness of 50 angstroms, and an upper silicon oxide layer was formed on the hafnium oxide layer to a thickness of 61 angstroms.

Comparative Example 1 the blocking layer was manufactured according to a conventional process, i.e., without a silicon oxynitride layer between the lower silicon oxide layer and the hafnium oxide layer. The materials and thicknesses of the lower silicon oxide layer, hafnium oxide layer, and upper silicon oxide layer were identical to those in Example 1.

Comparative Example 2 the blocking layer was manufactured according to a method used in Comparative Example 1, with the exception of forming the lower silicon oxide layer to a thickness of 52 angstroms instead of 61 angstroms.

The three non-volatile memory devices were compared in terms of equivalent oxide thickness (EOT) and leakage current through the blocking layer. The first non-volatile memory device was measured to have an EOT of 127 angstroms, the second non-volatile memory device was measured to have an EOT of 138 angstroms, and the third non-volatile memory device was measured to have an EOT of 128 angstroms. Results of leakage current through the blocking layer are illustrated in FIG. 13.

Figure 13:
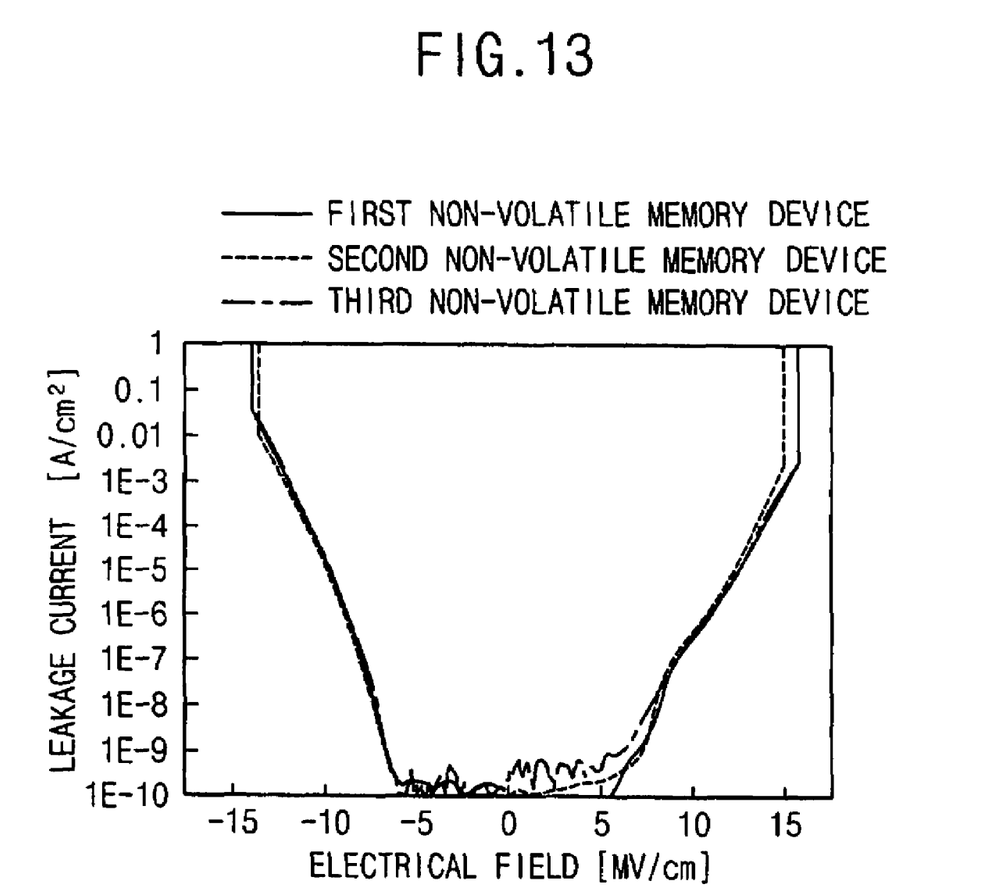
FIG. 13 illustrates a graph of leakage current characteristics of a non-volatile memory device in accordance with an embodiment of the present invention as compared to conventional non-volatile memory devices.

As illustrated in FIG. 13, the first non-volatile memory device showed improved leakage current characteristics, i.e., a curve represented by a solid line, as compared to the non-volatile memory devices of Comparative Examples 1-2, i.e., curves represented by respective dotted and dot-dash lines. In particular, as illustrated in FIG. 13, the first non-volatile memory device exhibited remarkably improved leakage current characteristics in a lower voltage area, i.e., between about 0 and 6 mV/cm, as compared with the second and third non-volatile memory devices. For example, as illustrated in FIG. 13, while the second and third non-volatile memory devices exhibited leakage current of up to about $10^{-8}$ $A/cm^2$, the first non-volatile memory device exhibited leakage current of about $10^{-9}$ $A/cm^2$.

Embodiments of the present invention may be advantageous in substantially minimizing or preventing mutual diffusion of silicon and metal between a lower silicon oxide layer and a metal oxide layer by forming a silicon oxynitride layer therebetween. Similarly, mutual diffusion of silicon and metal between an upper silicon oxide layer and the metal oxide layer may be substantially minimized or prevented by forming a second silicon oxynitride layer or a metal oxynitride layer therebetween. Therefore, leakage current through a blocking layer may be substantially decreased, thereby improving data reliability of a non-volatile memory device.

In the figures, the dimensions of layers and regions may be exaggerated for clarity. It will also be understood that when an element or layer is referred to as being "on," "connected to," or "coupled to" another element or layer, it can be directly on, connected to or coupled to the other element or layer, or intervening elements or layers may be present. Further, it will also be understood that when an element or layer is referred to as being "between" two elements or layers, it can be the only element or layer between the two elements or layers, or one or more intervening elements or layers may also be present. Like reference numerals refer to like elements throughout.

As used herein, the term "and/or" includes any and all combinations of one or more of the associated listed items.

In addition, it will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein to describe a relative relationship between elements and/or features with respect to the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. Further, unless otherwise defined, all terminology used herein is given its ordinary meaning as commonly understood by one of ordinary skill in the art.

Exemplary embodiments of the present invention have been disclosed herein, and although specific terms may be employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a non-volatile memory device, comprising:
   forming a tunnel isolation layer on a substrate;
   forming a conductive pattern on the tunnel isolation layer;
   forming a lower silicon oxide layer on the conductive pattern;
   treating a surface portion of the lower silicon oxide layer with a nitridation treatment to form a first silicon oxynitride layer on the lower silicon oxide layer;
   forming a metal oxide layer on the silicon oxynitride layer;
   forming an upper silicon oxide layer on the metal oxide layer; and
   forming a conductive layer on the upper silicon oxide layer.

2. The method as claimed in claim 1, wherein forming the metal oxide layer includes employing a metal oxide having a higher dielectric constant than a silicon nitride.

3. The method as claimed in claim 2, wherein forming the metal oxide layer includes employing one or more of hafnium, zirconium, tantalum, aluminum, lanthanum, cerium, praseodymium, neodymium, samarium, europium, gadolinium, terbium, dysprosium, holmium, erbium, thulium, ytterbium, and/or lutetium.

4. The method as claimed in claim 1, wherein treating the surface portion of the lower silicon oxide layer with the nitridation treatment includes performing a plasma nitridation treatment using nitrogen gas and/or ammonia gas.

5. The method as claimed in claim 1, wherein treating the surface portion of the lower silicon oxide layer with the nitridation treatment includes using a remote plasma system or a direct plasma system.

6. The method as claimed in claim 1, wherein treating the surface portion of the lower silicon oxide layer with the nitridation treatment includes processing at a temperature of about 500° C. or less.

7. The method as claimed in claim 1, wherein treating the surface portion of the lower silicon oxide layer with the nitridation treatment includes forming the first silicon oxynitride layer to a thickness of about 5 angstroms to about 20 angstroms.

8. The method as claimed in claim 1, further comprising performing a plasma nitridation treatment on the metal oxide layer to form a metal oxynitride layer between the metal oxide layer and the upper silicon oxide layer.

9. The method as claimed in claim 8, wherein performing the plasma nitridation treatment on the metal oxide layer includes processing at a temperature of about 500° C. or less.

10. The method as claimed in claim 9, wherein performing the plasma nitridation treatment on the metal oxide layer includes processing at a temperature of about 350° C. or less.

11. The method as claimed in claim 10, wherein performing the plasma nitridation treatment on the metal oxide layer includes processing at a temperature of about 250° C. to about 350° C.

12. The method as claimed in claim 8, wherein performing the plasma nitridation treatment on the metal oxide layer includes forming the metal oxynitride layer to a thickness of about 5 angstroms to about 20 angstroms.

13. The method as claimed in claim 1, further comprising forming a second silicon oxynitride layer between the metal oxide layer and the upper silicon layer.

14. The method as claimed in claim 13, wherein the second silicon oxynitride layer is formed directly on the metal oxide layer.

15. The method as claimed in claim 13, wherein forming the second silicon oxynitride layer includes performing a middle temperature oxynitride deposition or a high density plasma deposition on the metal oxide layer.

16. The method as claimed in claim 13, wherein the second silicon oxynitride layer is formed to a thickness of about 5 angstroms to about 20 angstroms.

17. The method as claimed in claim 13, wherein forming the second silicon oxynitride layer is performed in-situ with forming the upper silicon oxide layer.

18. The method as claimed in claim 1, further comprising forming a gate structure on the substrate by sequentially patterning the conductive layer, the upper silicon oxide layer, the metal oxide layer, the silicon oxynitride layer, the conductive pattern, and the tunnel isolation layer.

19. The method as claimed in claim 13, further comprising forming source/drain regions at surface portions of the substrate adjacent to the gate structure.

* * * * *